US012787313B2

(12) United States Patent
Nose et al.

(10) Patent No.: US 12,787,313 B2
(45) Date of Patent: Nov. 3, 2026

(54) SEMICONDUCTOR DEVICE

(71) Applicant: SUMITOMO ELECTRIC DEVICE INNOVATIONS, INC., Kanagawa (JP)

(72) Inventors: Yukinori Nose, Kanagawa (JP); Tsuyoshi Nakajima, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 408 days.

(21) Appl. No.: 18/175,863

(22) Filed: Feb. 28, 2023

(65) Prior Publication Data

US 2023/0402498 A1 Dec. 14, 2023

(30) Foreign Application Priority Data

Jun. 9, 2022 (JP) ................................. 2022-093827

(51) Int. Cl.

| | |
|---|---|
| ***H10D 1/68*** | (2025.01) |
| ***H10D 30/01*** | (2025.01) |
| ***H10D 30/47*** | (2025.01) |
| ***H10D 62/85*** | (2025.01) |
| ***H10D 84/80*** | (2025.01) |

(52) U.S. Cl.

CPC ........... *H10D 1/692* (2025.01); *H10D 30/015* (2025.01); *H10D 30/475* (2025.01); *H10D 62/8503* (2025.01); *H10D 84/811* (2025.01)

(58) Field of Classification Search

CPC ......... H01L 21/02293; H01L 21/02631; H01L 21/02634; H01L 21/2855; H01L 21/3147; H01L 21/76248; H01L 21/76262; H01L 21/76278; H01L 21/76294; H01L 21/76297; C30B 25/02–22; H10D 62/85–854; H10D 84/05; H10D 1/60–716; H10B 43/00–50; G11C 16/0466–0475; G11C 27/005; G11C 11/5671

See application file for complete search history.

(56) References Cited

U.S. PATENT DOCUMENTS 6,483,691 B1 11/2002 Nakamura
2002/0011616 A1 * 1/2002 Inoue ..................... H10B 53/30 257/295

(Continued)

FOREIGN PATENT DOCUMENTS

JP H03-125470 5/1991
JP 2007-180093 7/2007

(Continued)

*Primary Examiner* — Matthew C Landau
*Assistant Examiner* — Nora T. Nix
(74) *Attorney, Agent, or Firm* — IPUSA, PLLC

(57) ABSTRACT

A semiconductor device includes a substrate having a first upper surface; a semiconductor layer provided on the substrate; a first insulator layer provided over the semiconductor layer and having a second upper surface; a lower electrode provided over the first insulator layer; a dielectric layer provided on the lower electrode; and an upper electrode provided on the dielectric layer. A difference between a maximum value and a minimum value of a distance between the first upper surface of the substrate and the second upper surface of the first insulator layer is smaller than a thickness of the semiconductor layer.

8 Claims, 9 Drawing Sheets

(56) References Cited

U.S. PATENT DOCUMENTS

| | | | | |
|---|---|---|---|---|
| 2004/0151988 | A1 * | 8/2004 | Silverman | B82Y 40/00 430/5 |
| 2005/0156216 | A1 * | 7/2005 | Cross | H10D 1/696 257/310 |
| 2007/0165359 | A1 | 7/2007 | Kuwajima et al. | |
| 2017/0018421 | A1 | 1/2017 | Pawlak | |
| 2018/0061697 | A1 * | 3/2018 | Yamada | H10D 1/042 |
| 2019/0165134 | A1 | 5/2019 | Diaz et al. | |
| 2019/0371672 | A1 * | 12/2019 | Nakano | H10D 30/015 |

FOREIGN PATENT DOCUMENTS

| | | |
|---|---|---|
| JP | 2018-037497 | 3/2018 |
| JP | 2019-207945 | 12/2019 |
| TW | 442806 | 6/2001 |
| TW | 201703152 | 1/2017 |
| TW | 201926456 | 7/2019 |

* cited by examiner

SEMICONDUCTOR DEVICE

CROSS-REFERENCE TO RELATED APPLICATIONS

This application is based on and claims priority to Japanese Patent Application No. 2022-093827, filed on Jun. 9, 2022, the entire contents of which are incorporated herein by reference.

TECHNICAL FIELD

The present disclosure relates to a semiconductor device.

BACKGROUND

For example, a metal-insulator-metal (MIM) capacitor, including a lower electrode, an insulating film, and an upper electrode, may be formed in a semiconductor integrated circuit such as a monolithic microwave integrated circuit (MMIC), as described in Japanese Laid-Open Patent Publication No. 2018-37497 (Patent Document 1) and Japanese Laid-Open Patent Publication No. 2019-207945 (Patent Document 2).

SUMMARY

According to the present disclosure, a semiconductor device includes a substrate having a first upper surface; a semiconductor layer provided on the substrate; a first insulator layer provided over the semiconductor layer and having a second upper surface; a lower electrode provided over the first insulator layer; a dielectric layer provided on the lower electrode; and an upper electrode provided on the dielectric layer. A difference between a maximum value and a minimum value of a distance between the first upper surface and the second upper surface is smaller than a thickness of the semiconductor layer.

BRIEF DESCRIPTION OF THE DRAWINGS

Other objects and further features of the present invention will be apparent from the following detailed description when read in conjunction with the accompanying drawings, in which.

DETAILED DESCRIPTION

Description of Embodiments of Present Disclosure

Figure 1:
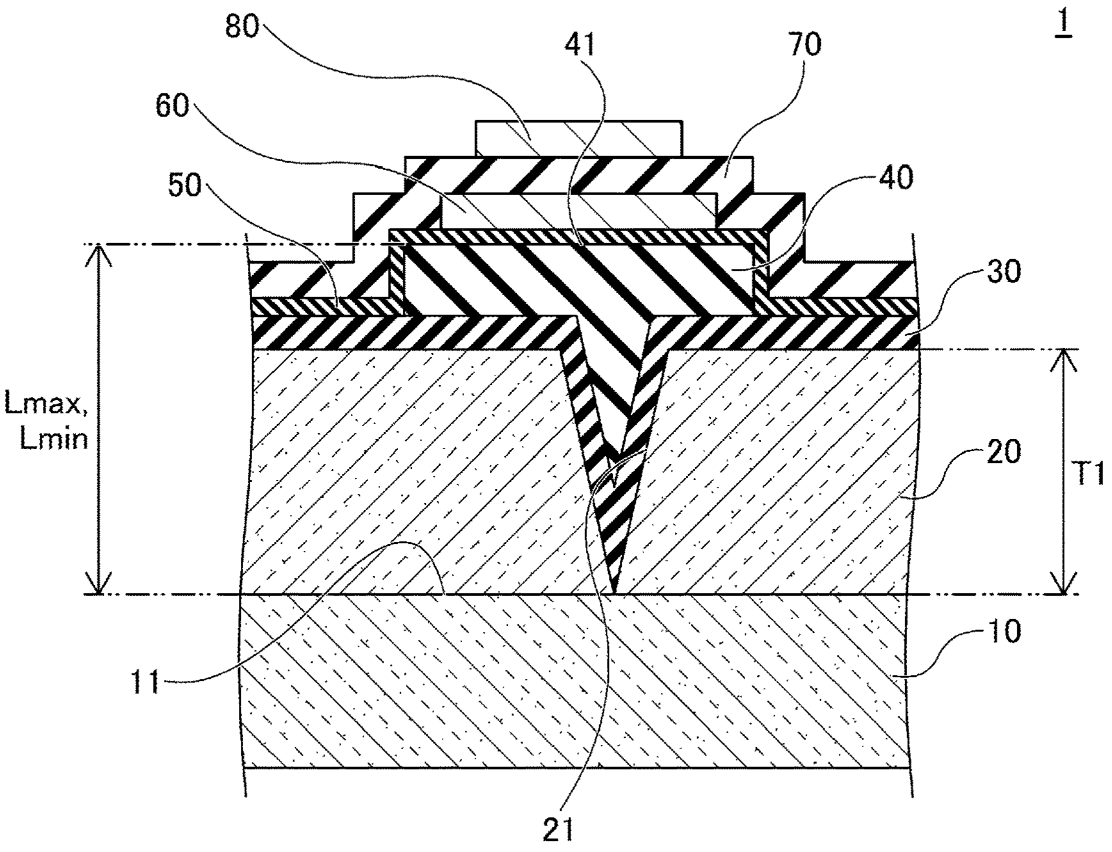
FIG. 1 is a cross-sectional view illustrating a semiconductor device according to a first embodiment.

A conventional MIM capacitor may be unable to provide sufficient withstand voltage between a lower electrode and an upper electrode.

According to the present disclosure, the stability of withstand voltage between a lower electrode and an upper electrode can be improved.

First, embodiments of the present disclosure will be listed and described.

(1) According to an aspect of the present disclosure, a semiconductor device includes a substrate having a first upper surface; a semiconductor layer provided on the substrate; a first insulator layer provided over the semiconductor layer and having a second upper surface; a lower electrode provided over the first insulator layer; a dielectric layer provided on the lower electrode; and an upper electrode provided on the dielectric layer. A difference between a maximum value and a minimum value of a distance between the first upper surface of the substrate and the second upper surface of the first insulator layer is smaller than a thickness of the semiconductor layer.

The first insulator layer is provided over the semiconductor layer, and the difference between the maximum value and the minimum value of the distance between the first upper surface and the second upper surface is smaller than the thickness of the semiconductor layer. Therefore, even if the semiconductor layer has a defect such as a pit, the flatness of each of the lower electrode and the upper electrode disposed over the first insulator layer can be increased as compared to when the first insulator layer is not provided. Therefore, dielectric breakdown between the lower electrode and the upper electrode can be minimized, and the stability of withstand voltage between the lower electrode and the upper electrode can be improved.

(2) According to (1), the first insulator layer may be a polyimide layer. Accordingly, the second upper surface tends to have excellent flatness.

(3) According to (2), the semiconductor device may further include a second insulator layer provided between the first insulator layer and the lower electrode and including silicon. Accordingly, excellent adhesion tends to be obtained between the first insulator layer (polyimide layer) and the second insulator layer, and excellent adhesion tends to be obtained between the second insulator layer and the lower electrode. Therefore, as compared to when the first insulator layer directly contacts the lower electrode, excellent adhesion can be obtained when the second insulator layer is provided between the first insulator layer and the lower electrode.

(4) According to (2) or (3), the semiconductor device may further include a third insulator layer provided between the semiconductor layer and the first insulator layer and including silicon. Accordingly, excellent adhesion tends to be obtained between the semiconductor layer and the third insulator layer, and excellent adhesion tends to be obtained between the third insulator layer and the first insulator layer (polyimide layer). Therefore, as compared to when the semiconductor layer directly contacts the first insulator layer, excellent adhesion can be obtained when the third insulator layer is provided between the semiconductor layer and the first insulator layer.

(5) According to (2), the semiconductor device may further include a second insulator layer provided between the first insulator layer and the lower electrode and including silicon, and a third insulator layer provided between the semiconductor layer and the first insulator layer and including silicon, wherein the second insulator layer may directly contact the third insulator layer. Accordingly, excellent adhesion can be obtained as compared to when the first insulator layer (polyimide layer) directly contacts the lower electrode. In addition, excellent adhesion can be obtained as compared to when the semiconductor layer directly contacts the first insulator layer. Further, the direction of stress generated in the second insulator layer and the direction of stress generated in the third insulator layer are the same when viewed from the first insulator layer, and thus, the first insulator layer can be less likely to warp.

(6) According to any one of (1) to (5), the difference between the maximum value and the minimum value may be 100 nm or less. Accordingly, the stability of withstand voltage between the lower electrode and the upper electrode tends to be improved.

(7) According to any one of (1) to (5), the difference between the maximum value and the minimum value may be 50 nm or less. Accordingly, the stability of withstand voltage between the lower electrode and the upper electrode tends to be further improved.

(8) According to any one of (1) to (7), the semiconductor layer may be a nitride semiconductor layer. Accordingly, a high electron mobility transistor (HEMT) using the nitride semiconductor layer and a MIM capacitor can be monolithically integrated.

Details of Embodiments of Present Disclosure

In the following, the embodiments of the present disclosure will be described in detail; however, the present disclosure is not limited thereto. In the specification and the drawings, elements having substantially the same functional configurations are referenced by the same reference numerals, and the description thereof will not be repeated.

First Embodiment

First, a first embodiment will be described. The first embodiment relates to a semiconductor device including a MIM capacitor. FIG. 1 is a cross-sectional view illustrating a semiconductor device according to the first embodiment.

As illustrated in FIG. 1, a semiconductor device 1 according to the first embodiment mainly includes a substrate 10, a semiconductor layer 20, a first insulator layer 40, a second insulator layer 50, a third insulator layer 30, a lower electrode 60, a dielectric layer 70, and an upper electrode 80.

The substrate 10 is, for example, a silicon carbide (SiC) substrate of polytype 4H or 6H. The upper surface of the silicon carbide substrate may be either a silicon polar surface or a carbon polar surface. The substrate 10 may be a silicon substrate. The upper surface of the silicon substrate is, for example, a (111) plane.

The semiconductor layer 20 is provided on the substrate 10. The semiconductor layer 20 is, for example, a nitride semiconductor layer. The nitride semiconductor layer constitutes part of a high electron mobility transistor (HEMT) such as an electron transit layer or an electron supply layer. The HEMT (not illustrated) is provided separately from the MIM capacitor. The semiconductor layer 20 may have a defect 21 such as a pit. Although details will be described later, the semiconductor layer 20 is formed on the substrate 10 by an epitaxial growth method. If there is a defect in the upper surface 11 of the substrate 10, the defect 21 may be formed.

The third insulator layer 30 is provided on the semiconductor layer 20. The third insulator layer 30 is, for example, a silicon oxide ($SiO_2$) layer. The third insulator layer 30 is formed so as to conform to the shape of the upper surface of the semiconductor layer 20. The upper surface of the third insulator layer 30 may have a recess that reflects the shape of the defect 21. The third insulator layer 30 constitutes, for example, part of the HEMT.

The first insulator layer 40 is provided on the third insulator layer 30. The first insulator layer 40 is provided on a portion of the third insulator layer 30. The first insulator layer 40 is, for example, a polyimide layer. The first insulator layer 40 may be a silicon oxide layer. Although details will be described later, the first insulator layer 40 is formed by applying and curing a raw material. Therefore, even if the upper surface of the third insulator layer 30 has a recess, the first insulator layer 40 fills the recess in the upper surface of the third insulator layer 30, and also an upper surface 41 of the first insulator layer 40 is flat. For example, the distance between the upper surface 11 of the substrate 10 and the upper surface 41 of the first insulator layer 40 is constant, and a maximum value Lmax and a minimum value Lmin of the distance are equal to each other. Therefore, the difference between the maximum value Lmax and the minimum value Lmin is smaller than a thickness T1 of the semiconductor layer 20. As used herein, the term "flat" is not intended to mean that a surface has no irregularities on the order of nanometers, but is intended to mean that a surface is "flat" to a socially acceptable degree.

The second insulator layer 50 is provided on the first insulator layer 40 and the third insulator layer 30. The second insulator layer 50 covers the first insulator layer 40. The second insulator layer 50 is, for example, a silicon nitride (SiN) layer or a silicon oxide layer. The second insulator layer 50 directly contacts the third insulator layer 30.

The lower electrode 60 is provided on the second insulator layer 50. The lower electrode 60 is provided on the second insulator layer 50 and above the first insulator layer 40. The lower electrode 60 is located within the contour of the first insulator layer 40 in a plan view, that is, when viewed in a direction perpendicular to the upper surface 11. The lower electrode 60 includes, for example, a titanium (Ti) film and a gold (Au) film disposed on the titanium film.

The dielectric layer 70 is provided on the lower electrode 60 and the second insulator layer 50. The dielectric layer 70 covers the upper surface and the side surface of the lower electrode 60. The dielectric layer 70 includes a nitride or an oxide of, for example, silicon, aluminum (Al), hafnium (Hf), or zirconium (Zr). For example, the dielectric layer 70 is a silicon nitride layer, an aluminum oxide (AlO) layer, or a silicon oxide layer. The dielectric layer 70 may include more than one of the above-described metal species. The dielectric layer 70 may include an oxynitride of any of the above-described metal species.

The upper electrode 80 is provided on the dielectric layer 70. The upper electrode 80 is provided on the dielectric layer 70 and above the lower electrode 60. The upper electrode 80 is located within the contour of the lower electrode 60 in a plan view. The upper electrode 80 includes, for example, a titanium film and a gold film disposed on the titanium film.

Next, a method of manufacturing the semiconductor device 1 according to the first embodiment will be described. FIG. 2 through FIG. 8 are cross-sectional views illustrating the method of manufacturing the semiconductor device 1 according to the first embodiment.

Figure 2:
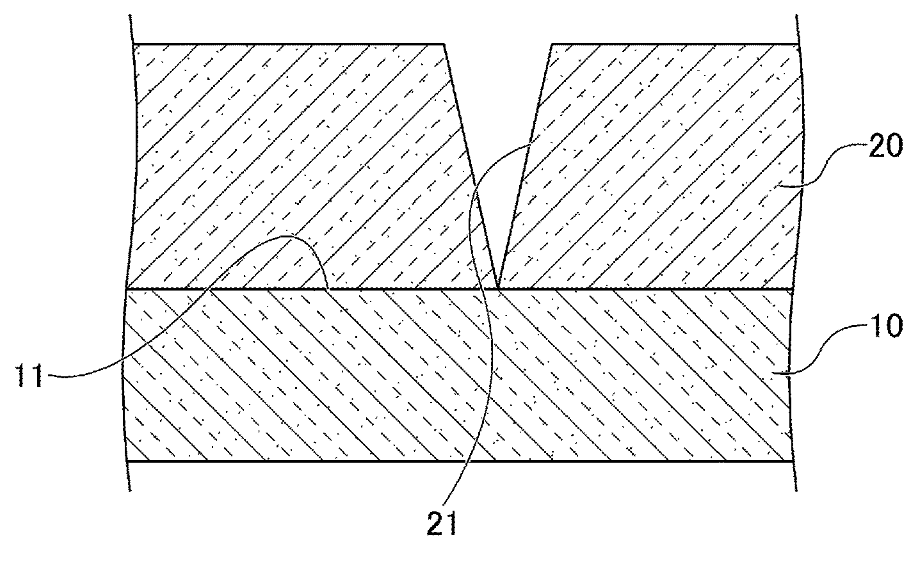
FIG. 2 is a cross-sectional view (part 1) illustrating a method of manufacturing the semiconductor device according to the first embodiment.

First, as illustrated in FIG. 2, the semiconductor layer 20 is formed on the substrate 10 by an epitaxial growth method. For example, the semiconductor layer 20 can be formed by a metal organic chemical vapor deposition (MOCVD) method. The upper surface 11 of the substrate 10 may have a defect, and the defect 21 such as a pit may be formed in the semiconductor layer 20.

Figure 3:
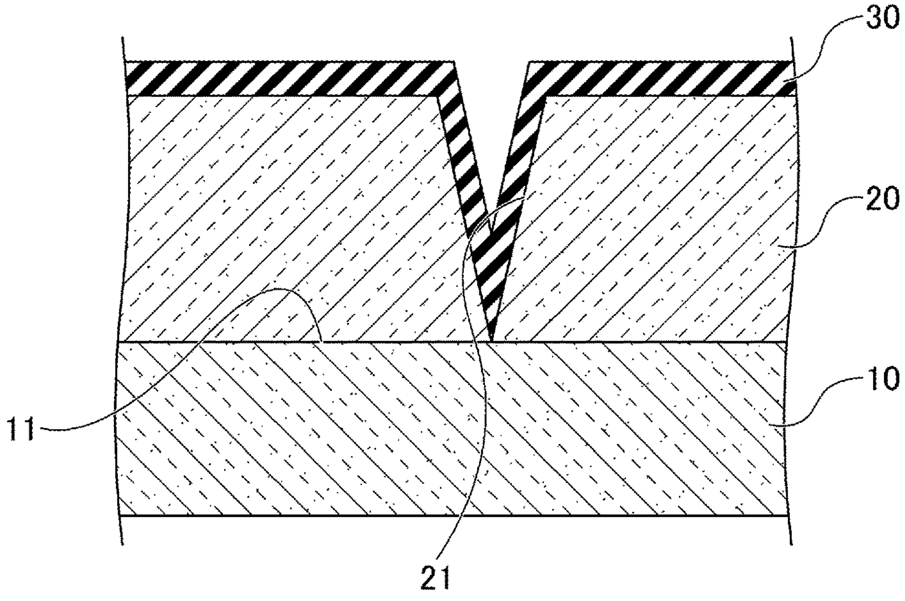
FIG. 3 is a cross-sectional view (part 2) illustrating the method of manufacturing the semiconductor device according to the first embodiment.

Next, as illustrated in FIG. 3, the third insulator layer 30 is formed on the semiconductor layer 20 by a chemical vapor deposition (CVD) method.

Figure 4:
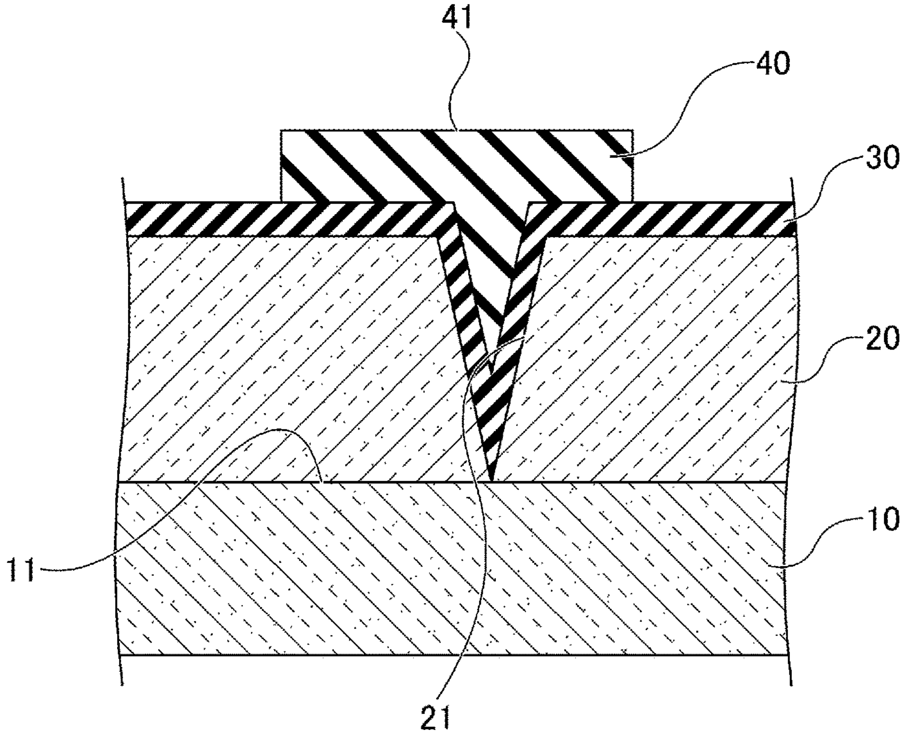
FIG. 4 is a cross-sectional view (part 3) illustrating the method of manufacturing the semiconductor device according to the first embodiment.

Next, as illustrated in FIG. 4, the first insulator layer 40 is formed on the third insulator layer 30. The first insulator layer 40 is, for example, a polyimide layer or a silicon oxide layer. If the first insulator layer 40 is a polyimide layer, the first insulator layer 40 can be formed by the spin-coating, exposure, development, and firing of photosensitive polyimide. The first insulator layer 40 may be formed by spin-coating, firing, and etching non-photosensitive polyimide. If the first insulator layer 40 is a silicon oxide layer, the first insulator layer 40 can be formed by spin-coating, firing, and etching spin-on-glass.

Figure 5:
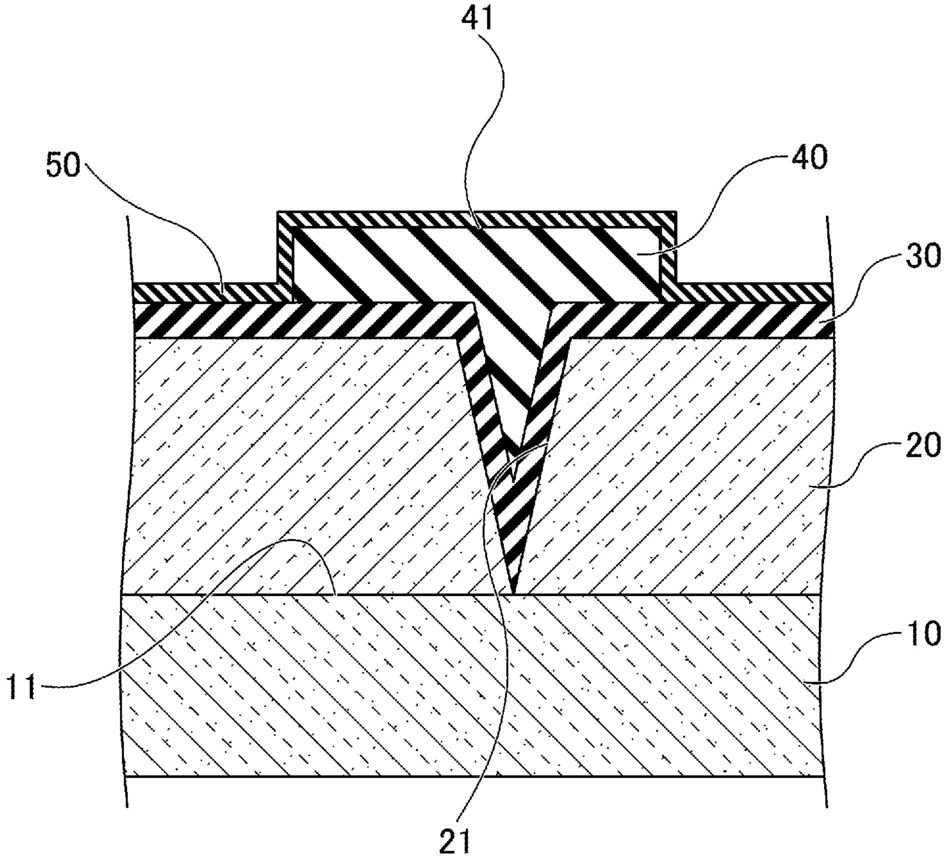
FIG. 5 is a cross-sectional view (part 4) illustrating the method of manufacturing the semiconductor device according to the first embodiment.

Next, as illustrated in FIG. 5, the second insulator layer 50 is formed on the first insulator layer 40 and the third insulator layer 30 by the CVD method. The first insulator layer 40 is covered by the second insulator layer 50.

Figure 6:
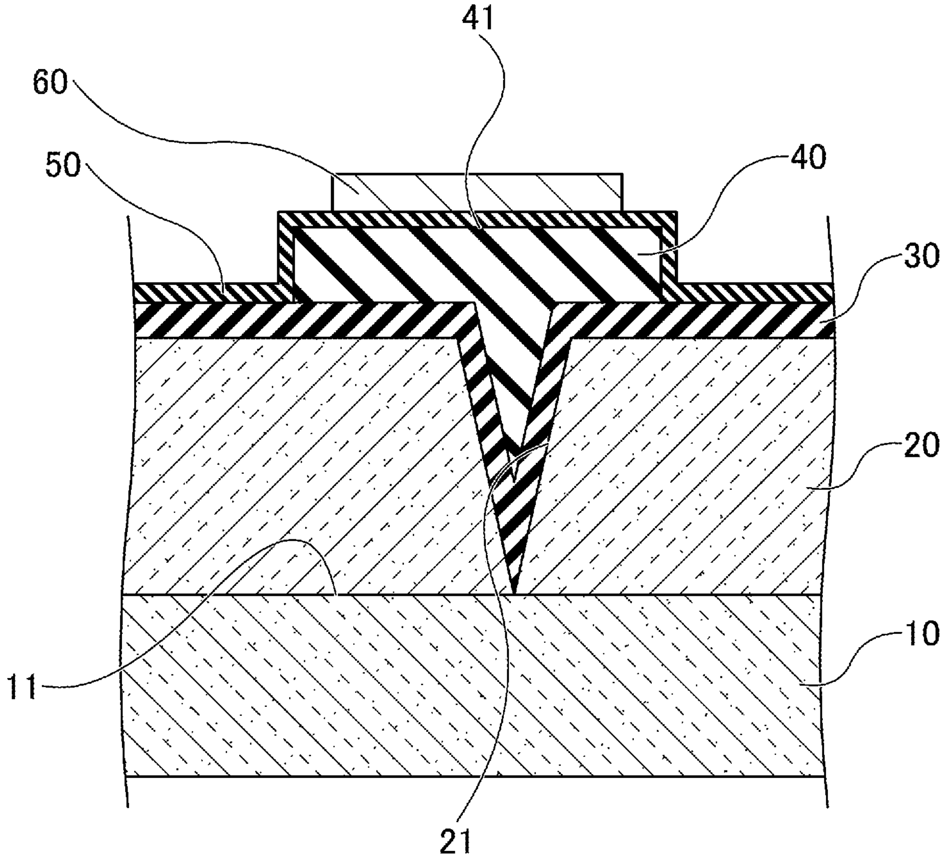
FIG. 6 is a cross-sectional view (part 5) illustrating the method of manufacturing the semiconductor device according to the first embodiment.

Next, as illustrated in FIG. 6, the lower electrode 60 is formed on the second insulator layer 50. In the formation of the lower electrode 60, for example, a titanium film and a gold film are formed on the entire surface, and subsequently, the titanium film and the gold film are etched. The etching may be either wet etching or dry etching. The lower electrode 60 may be formed by vapor deposition and lift-off of a titanium film and a gold film. In any method, since the first insulator layer 40 is covered by the second insulator layer 50, the first insulator layer 40 is not exposed to a process environment during the formation of the lower electrode 60.

Figure 7:
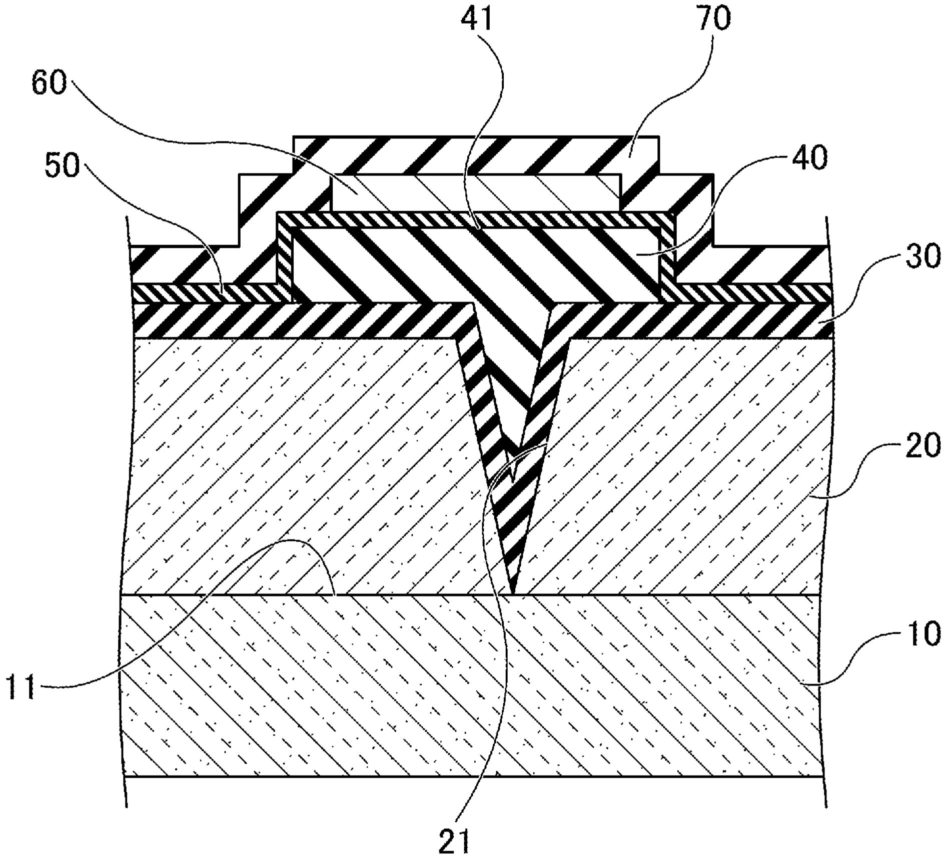
FIG. 7 is a cross-sectional view (part 6) illustrating the method of manufacturing the semiconductor device according to the first embodiment.

Next, as illustrated in FIG. 7, the dielectric layer 70 is formed on the lower electrode 60 and the second insulator layer 50 by the CVD method. The lower electrode 60 is covered by the dielectric layer 70.

Figure 8:
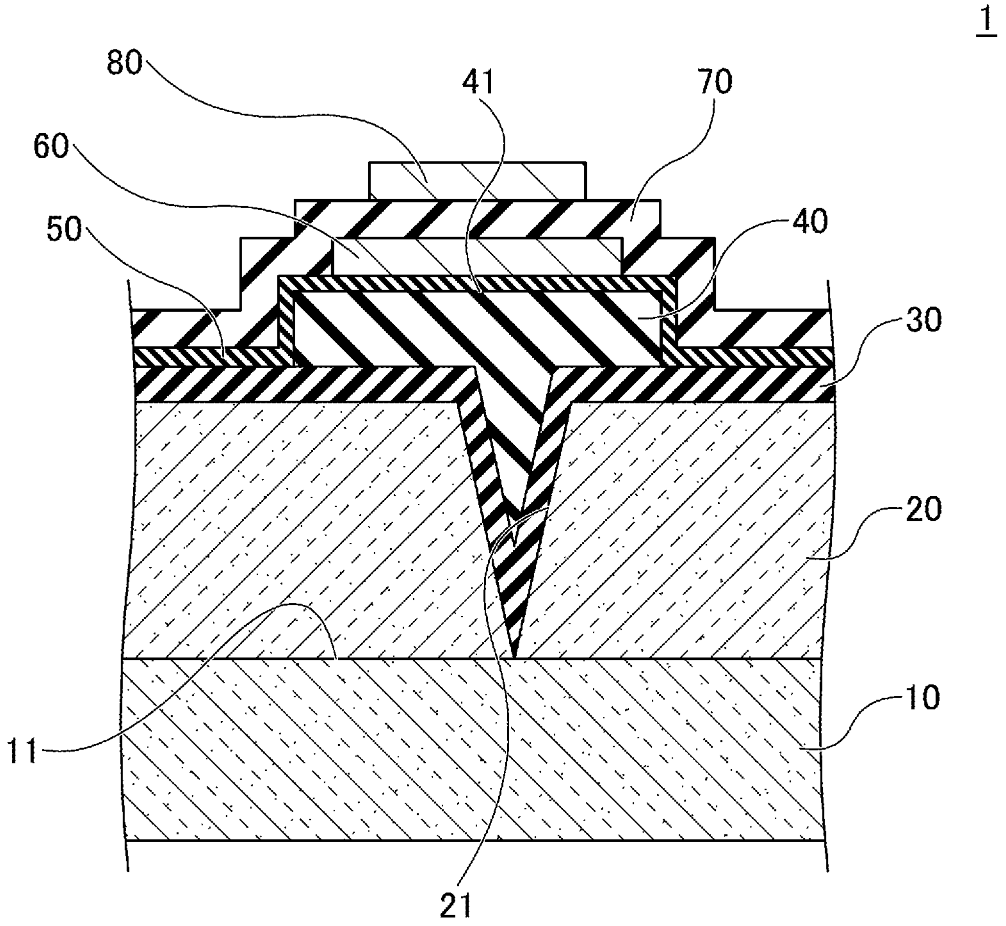
FIG. 8 is a cross-sectional view (part 7) illustrating the method of manufacturing the semiconductor device according to the first embodiment.

Next, as illustrated in FIG. 8, the upper electrode 80 is formed on the dielectric layer 70. The upper electrode 80 can be formed by, for example, vapor deposition and lift-off of a titanium film and a gold film.

Accordingly, the semiconductor device 1 according to the first embodiment can be manufactured.

Figure 9:
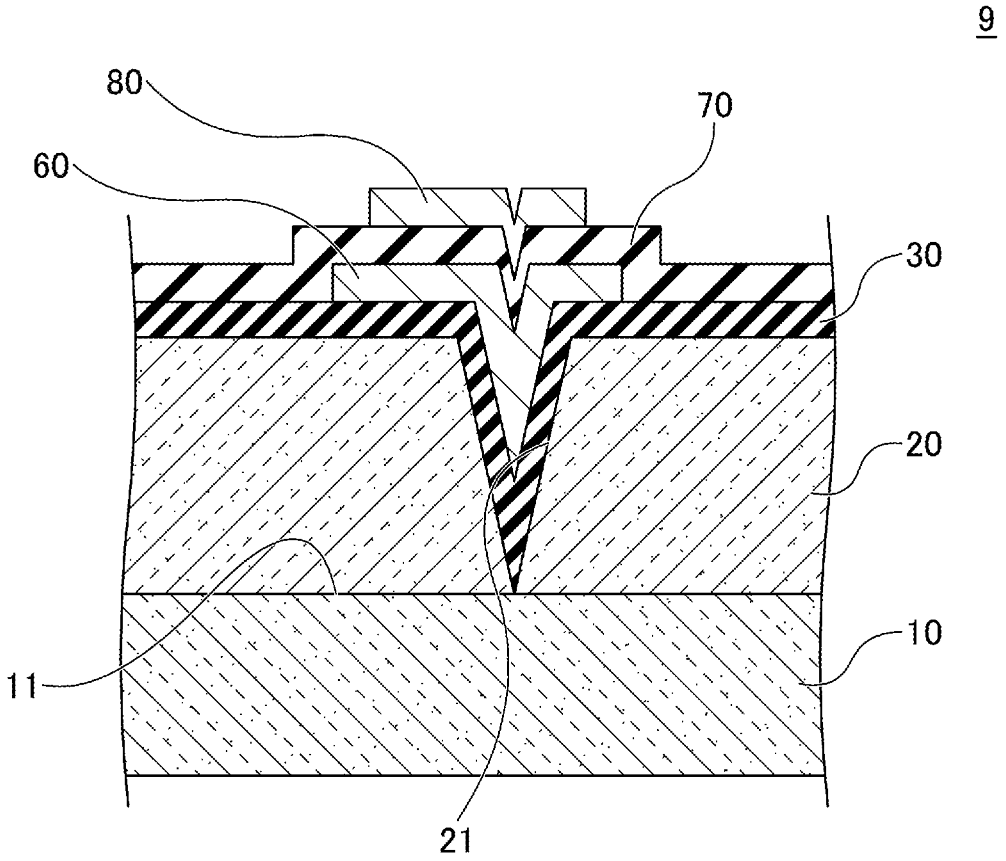
FIG. 9 is a cross-sectional view illustrating a semiconductor device according to a comparative example.

Effects of the first embodiment will be described with reference to a comparative example. FIG. 9 is a cross-sectional view illustrating a semiconductor device according to a comparative example. Note that FIG. 9 is used for facilitating the understanding of the present disclosure and does not describe the prior art.

A semiconductor device 9 according to the comparative example differs from that of the first embodiment mainly in that the first insulator layer 40 and the second insulator layer 50 are not included. A lower electrode 60 is provided on a third insulator layer 30. A dielectric layer 70 is provided on a lower electrode 60 and a third insulator layer 30. The dielectric layer 70 covers the lower electrode 60. An upper electrode 80 is provided on the dielectric layer 70. The shapes of the lower electrode 60, the dielectric layer 70, and the upper electrode 80 reflect the shape of a defect 21.

In the semiconductor device 9 according to the comparative example, since the shapes of the lower electrode 60, the dielectric layer 70, and the upper electrode 80 reflect the shape of the defect 21, the dielectric layer 70 is locally thin, and the electric field tends to be concentrated in particular areas of the lower electrode 60 and the upper electrode 80. Conversely, in the semiconductor device 1 according to the first embodiment, since the first insulator layer 40 is provided, the shapes of the lower electrode 60, the dielectric layer 70, and the upper electrode 80 hardly reflect the shape of the defect 21. Accordingly, the dielectric layer 70 has a constant thickness between the lower electrode 60 and the upper electrode 80, and the concentration of the electric field in the lower electrode 60 and the upper electrode 80 is reduced. Therefore, according to the first embodiment, the stability of withstand voltage between the lower electrode 60 and the upper electrode 80 can be improved.

If the first insulator layer 40 is a polyimide layer, the upper surface 41 of the first insulator layer 40 tends to have excellent flatness. Accordingly, the stability of withstand voltage tends to be improved.

By providing the second insulator layer 50, including silicon, between the first insulator layer 40 and the lower electrode 60, excellent adhesion tends to be obtained between the first insulator layer 40 and the lower electrode 60 as compared to when the second insulator layer 50 is not provided. This is because excellent adhesion tends to be obtained between the first insulator layer 40 and the second insulator layer 50, and excellent adhesion tends to be obtained between the second insulator layer 50 and the lower electrode 60. Further, the first insulator layer 40 can be prevented from being exposed to a process environment during the formation of the lower electrode 60.

By providing the third insulator layer 30, including silicon, between the semiconductor layer 20 and the first insulator layer 40, excellent adhesion tends to be obtained between the semiconductor layer 20 and the first insulator layer 40 as compared to when the third insulator layer 30 is not provided. This is because excellent adhesion tends to be obtained between the semiconductor layer 20 and the third insulator layer 30, and excellent adhesion tends to be obtained between the third insulator layer 30 and the first insulator layer 40.

The direction of stress generated in the second insulator layer 50 and the direction of stress generated in the third insulator layer 30 are the same when viewed from the first insulator layer 40. Therefore, by causing the second insulator layer 50 and the third insulator layer 30 to directly contact each other, the first insulator layer 40 can be less likely to warp.

Figure 10:
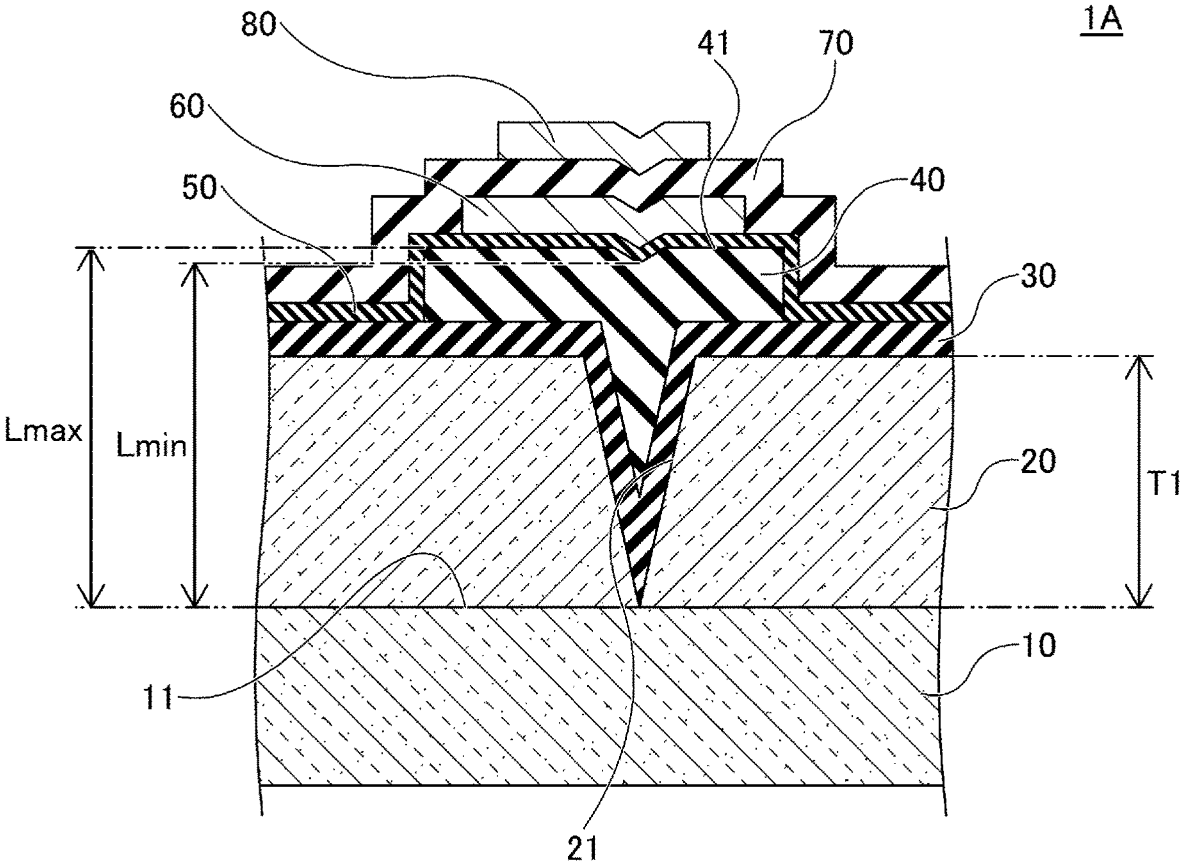
FIG. 10 is a cross-sectional view illustrating a semiconductor device according to a modification of the first embodiment.

The maximum value Lmax and the minimum value Lmin of the distance between the upper surface 11 of the substrate 10 and the upper surface 41 of the first insulator layer 40 are not required to be equal to each other. FIG. 10 is a cross-sectional view illustrating a semiconductor device according to a modification of the first embodiment. As illustrated in FIG. 10, a semiconductor device 1A according to the modification of the first embodiment, a small recess is formed in the upper surface 41 of the first insulator layer 40. In the semiconductor device 1A as well, if the difference between the maximum value Lmax and the minimum value Lmin is smaller than the thickness T1 of the semiconductor layer 20, the concentration of the electric field in the lower electrode 60 and the upper electrode 80 can be reduced, and thus, the stability of withstand voltage between the lower electrode 60 and the upper electrode 80 can be improved.

The difference between the maximum value Lmax and the minimum value Lmin is preferably 100 nm or less, more preferably 50 nm or less, and still more preferably 20 nm or less. As the difference between the maximum value Lmax and the minimum value Lmin decreases, the flatness of each of the lower electrode 60 and the upper electrode 80 tends to be increased, and the stability of withstand voltage between the lower electrode 60 and the upper electrode 80 tends to be improved.

The semiconductor layer 20 is a nitride semiconductor layer, and the HEMT using the nitride semiconductor layer and the MIM capacitor can be monolithically integrated.

Second Embodiment

Figure 11:
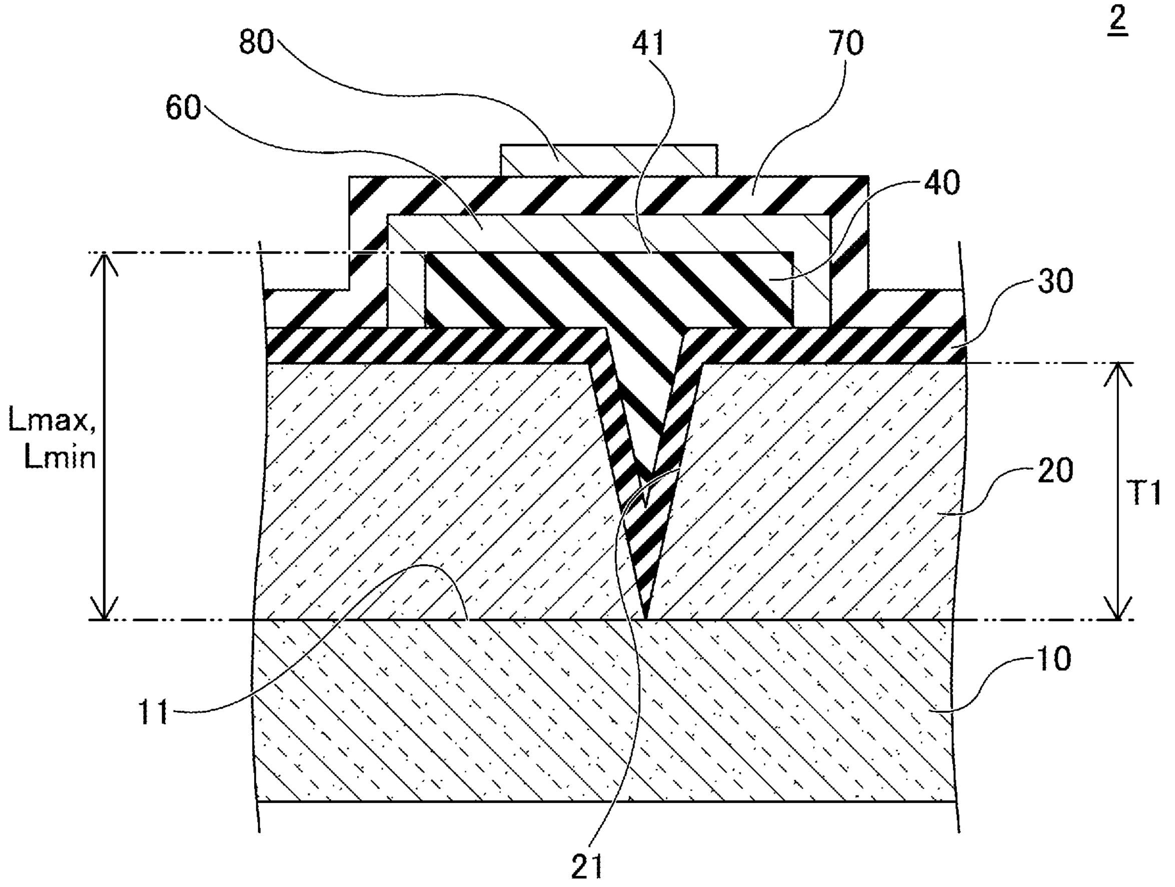
FIG. 11 is a cross-sectional view illustrating a semiconductor device according to a second embodiment.

Next, a second embodiment will be described. The second embodiment differs from the first embodiment mainly in that the second insulator layer 50 is not provided. FIG. 11 is a cross-sectional view illustrating a semiconductor device according to the second embodiment.

As illustrated in FIG. 11, a semiconductor device 2 according to the second embodiment does not include the second insulator layer 50, and the lower electrode 60 directly contacts the first insulator layer 40. The lower electrode 60 covers the upper surface 41 and the side surface of the first insulator layer 40. In addition, the lower electrode 60 directly contacts the third insulator layer 30. The dielectric layer 70 is provided on the lower electrode 60 and the third insulator layer 30. The dielectric layer 70 covers the upper surface and the side surface of the lower electrode 60.

Other configurations are the same as those of the first embodiment.

Similar to the first embodiment, the stability of withstand voltage between the lower electrode 60 and the upper electrode 80 can be improved according to the second embodiment as well. Further, since the second insulator layer 50 is not provided, there may be cases where the adhesion between the lower electrode 60 and the first insulator layer 40 is lower than that of the first embodiment. However, since the lower electrode 60 directly contacts the third insulator layer 30, the lower electrode 60 is not readily peeled.

In the first embodiment, the lower electrode 60 may cover the side surface of the first insulator layer 40 with the second insulator layer 50 interposed therebetween.

Although the embodiments have been described in detail above, the present invention is not limited to a specific embodiment, and various modifications and alterations can be made within the scope described in the claims.

What is claimed is:

1. A semiconductor device comprising:
- a substrate having a first upper surface;
- a semiconductor layer provided on the substrate;
- a first insulator layer provided over the semiconductor layer and having a second upper surface;
- a lower electrode provided over the first insulator layer;
- a dielectric layer provided on the lower electrode;
- an upper electrode provided on the dielectric layer;
- a second insulator layer provided between the first insulator layer and the lower electrode and including silicon;
- a third insulator layer directly contacting the semiconductor layer and the first insulator layer and including silicon,
- wherein the first insulator layer is a polyimide layer,
- wherein the second insulator layer directly contacts the third insulator layer,
- wherein a difference between a maximum value and a minimum value of a distance between the first upper surface of the substrate and the second upper surface of the first insulator layer is smaller than a thickness of the semiconductor layer, and
- wherein the first insulator layer directly contacts the second insulator layer and the third insulator layer.

2. The semiconductor device according to claim 1, wherein the difference between the maximum value and the minimum value is 100 nm or less.

3. The semiconductor device according to claim 1, wherein the difference between the maximum value and the minimum value is 50 nm or less.

4. The semiconductor device according to claim 1, wherein the semiconductor layer is a nitride semiconductor layer.

5. A semiconductor device comprising:
- a substrate having a first upper surface;
- a semiconductor layer provided on the substrate, and having a pit penetrating the semiconductor layer;
- a first insulator layer provided over the semiconductor layer and having a second upper surface;
- a lower electrode provided over the first insulator layer;
- a dielectric layer provided on the lower electrode;
- an upper electrode provided on the dielectric layer;
- a second insulator layer provided between the first insulator layer and the lower electrode and including silicon; and
- a third insulator layer provided between the semiconductor layer and the first insulator layer and including silicon,
- wherein a difference between a maximum value and a minimum value of a distance between the first upper surface of the substrate and the second upper surface of the first insulator layer is smaller than a thickness of the semiconductor layer, above the pit in the semiconductor layer,
- wherein the first insulator layer is a polyimide layer and is filing the pit of the semiconductor layer,
- wherein the first insulator layer directly contacts the second insulator layer and the third insulator layer, and
- wherein the second insulator layer directly contacts the third insulator layer.

6. The semiconductor device according to claim 5, wherein the difference between the maximum value and the minimum value is 100 nm or less.

7. The semiconductor device according to claim 5, wherein the difference between the maximum value and the minimum value is 50 nm or less.

8. The semiconductor device according to claim 5, wherein the semiconductor layer is a nitride semiconductor layer.

* * * * *